United States Patent
Shiba (10) Patent No.: US 12,098,460 B2
(45) Date of Patent: Sep. 24, 2024

(54) SYSTEMS AND METHODS FOR STABILIZING REACTION CHAMBER PRESSURE

(71) Applicant: ASM IP Holding B.V., Almere (NL)

(72) Inventor: Eiichiro Shiba, Hachioji (JP)

(73) Assignee: ASM IP Holding B.V., Almere (NL)

( * ) Notice: Subject to any disclaimer, the term of this patent is extended or adjusted under 35 U.S.C. 154(b) by 222 days.

(21) Appl. No.: 17/153,862

(22) Filed: Jan. 20, 2021

(65) Prior Publication Data

US 2021/0230746 A1 Jul. 29, 2021

Related U.S. Application Data

(60) Provisional application No. 62/964,886, filed on Jan. 23, 2020.

(51) Int. Cl.
| C23C 16/44 | (2006.01) |
| C23C 16/455 | (2006.01) |
| C23C 16/52 | (2006.01) |
| H01J 37/32 | (2006.01) |

(52) U.S. Cl.
CPC .... *C23C 16/4412* (2013.01); *C23C 16/45561* (2013.01); *C23C 16/52* (2013.01); *H01J 37/32449* (2013.01); *H01J 37/32816* (2013.01); *H01J 37/32834* (2013.01); *H01J 37/3299* (2013.01)

(58) Field of Classification Search
CPC .......... C23C 16/4412; C23C 16/45523; C23C 16/45557; C23C 16/45561; C23C 16/52; C30B 25/14; C30B 25/165; G05D 7/0652; G05D 11/139; G05D 16/2013; H01J 37/3244; H01J 37/32449; H01J 37/32816; H01J 37/32834; H01J 37/3299
See application file for complete search history.

(56) References Cited

U.S. PATENT DOCUMENTS

| 5,496,408 | A | * | 3/1996 | Motoda | H01L 21/0262 257/E21.101 |
| 6,231,672 | B1 | * | 5/2001 | Choi | C23C 16/45561 204/298.07 |
| 8,235,001 | B2 | * | 8/2012 | Sano | C23C 16/4408 118/695 |
| 11,393,703 | B2 | * | 7/2022 | Lerner | C23C 16/303 |
| 2002/0192369 | A1 | * | 12/2002 | Morimoto | C23C 16/45561 118/712 |

(Continued)

*Primary Examiner* — Benjamin Kendall
(74) *Attorney, Agent, or Firm* — Snell & Wilmer L.L.P.

(57) ABSTRACT

A reactor system may comprise a first gas source; a second gas source; and a reaction chamber fluidly coupled to the first and second gas sources, wherein a first gas and a second may be supplied to the reaction chamber from the first and second gas sources, respectively, to achieve stability of a reaction chamber pressure. The reactor system may further comprise an exhaust line fluidly coupled to and downstream from the reaction chamber; a vent line fluidly coupled to the first and/or second gas source, and to the exhaust line, wherein the vent line bypasses the reaction chamber; a pressure monitor coupled to the vent line configured to monitor a vent line pressure within the vent line; and/or a vent line conductance control valve coupled to the vent line and configured to adjust in response to feedback from the pressure monitor.

13 Claims, 4 Drawing Sheets

(56) References Cited

U.S. PATENT DOCUMENTS

| | | | |
|---|---|---|---|
| 2004/0118342 A1* | 6/2004 | Cheng | C23C 16/455 |
| | | | 118/715 |
| 2005/0145181 A1 | 7/2005 | Dickinson | |
| 2005/0241763 A1* | 11/2005 | Huang | C23C 16/45565 |
| | | | 156/345.33 |
| 2006/0121211 A1* | 6/2006 | Choi | C23C 16/401 |
| | | | 427/248.1 |
| 2006/0175012 A1 | 8/2006 | Lee | |
| 2007/0116888 A1* | 5/2007 | Faguet | H01J 37/32623 |
| | | | 700/121 |
| 2007/0251452 A1* | 11/2007 | Tanaka | C23C 16/45561 |
| | | | 257/E21.171 |
| 2008/0078505 A1* | 4/2008 | Kofuji | H01L 21/31116 |
| | | | 257/E21.252 |
| 2014/0041804 A1* | 2/2014 | Nagatani | C23C 16/45561 |
| | | | 73/195 |
| 2018/0277402 A1* | 9/2018 | Kawakami | H01L 21/67069 |
| 2019/0164725 A1* | 5/2019 | Kawakami | H01L 21/31116 |
| 2019/0169742 A1* | 6/2019 | Ishibashi | C23C 16/4412 |
| 2019/0368041 A1 | 12/2019 | Sreeram et al. | |
| 2022/0328288 A1* | 10/2022 | Kakimoto | H01J 37/32 |

\* cited by examiner

SYSTEMS AND METHODS FOR STABILIZING REACTION CHAMBER PRESSURE

CROSS-REFERENCE TO RELATED APPLICATIONS

This application claims the benefit of and priority to U.S. Provisional Application No. 62/964,886, filed on Jan. 23, 2020 in the United States Patent and Trademark Office, the disclosure of which is incorporated herein in its entirety by reference.

FIELD OF THE DISCLOSURE

The present disclosure generally relates to a gas supply system for a reaction chamber, particularly to a method for stabilizing reaction chamber pressure while supplying gas to the reaction chamber.

BACKGROUND

Reaction chambers may be used for depositing various material layers onto semiconductor substrates. A substrate may be placed on a susceptor inside a reaction chamber. Both the substrate and the susceptor may be heated to a desired substrate temperature set point. In an example substrate treatment process, one or more reactant gases may be passed over a heated substrate, causing the deposition of a thin film of material on the substrate surface. Throughout subsequent deposition, doping, lithography, etch, and/or other processes, these layers are made into devices such as integrated circuits.

For any given process, reactant gases and/or any byproduct gases may then be evacuated via a vacuum and/or purged from the reaction chamber. Controlling a flow rate and supply time of material comprising a reactant gas, for example, for forming a film is important to achieve a desired result and desired device stability. Additionally, maintaining a substantially constant pressure within the reaction chamber before, during, and/or after a reaction may facilitate achieving desired results in the resulting deposited layer on the substrate.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, a reactor system is provided. The reactor system disclosed herein may comprise a gas supply system allowing stabilization of the pressure within a reaction chamber of the reactor system. Therefore, for example, changing the gases being supplied to a reaction chamber during a process, such as a deposition, etch, or cleaning process, within a reaction chamber may not materially affect the reaction chamber pressure, allowing more control over the process and results thereof.

In various embodiments, a reactor system may comprise a first gas source; a first gas supply path fluidly coupled to the first gas source; a second gas source; a second gas supply path fluidly coupled to the second gas source; a reaction chamber fluidly coupled to the first gas supply path and the second gas supply path, wherein the first gas supply path may be fluidly coupled to the reaction chamber at a first gas supply path end, and the second gas supply path may be fluidly coupled to the reaction chamber at a second gas supply path end, wherein a first gas may be supplied to the reaction chamber from the first gas source and a second gas may be supplied to the reaction chamber from the second gas source to achieve stability of a reaction chamber pressure; an exhaust line fluidly coupled to and downstream from the reaction chamber; a vent line fluidly coupled to at least one of the first gas supply path and the second gas supply path, and to the exhaust line, wherein the vent line bypasses the reaction chamber; a pressure monitor coupled to the vent line configured to monitor a vent line pressure within the vent line; and/or a vent line conductance control valve coupled to the vent line, wherein the vent path conductance control valve may be configured to adjust in response to feedback from the pressure monitor.

In various embodiments, the reaction chamber may be fluidly coupled to the first gas supply path and the second gas supply path via a chamber inlet path, wherein the first gas supply path may be fluidly coupled to the chamber inlet path at the first gas supply path end, and the second gas supply path may be fluidly coupled to the chamber inlet path at the second gas supply path end. In various embodiments, the first gas supply path may comprise a first gas mainline and a first gas branch line, wherein the first gas mainline may be in fluid communication with the reaction chamber, and wherein the first gas branch line may be in fluid communication with the vent line. In various embodiments, the second gas supply path may comprise a second gas mainline and a second gas branch line, wherein the second gas mainline may be in fluid communication with the reaction chamber, and wherein the second gas branch line may be in fluid communication with the vent line.

In various embodiments, the first gas mainline may comprise a first mainline valve disposed upstream of the reaction chamber and downstream of the first gas branch line, wherein the first gas branch line may comprise a first branch line valve. The second gas mainline may comprise a second mainline valve disposed upstream of the reaction chamber and downstream of the second gas branch line, wherein the second gas branch line may comprise a second branch line valve, wherein the first mainline valve, the second mainline valve, the first branch line valve, and the second branch line valve may be configured to at least partially increase or decrease a gas flow through the first gas mainline, the second gas mainline, the first gas branch line, and the second gas branch line, respectively.

In various embodiments, the reactor system may further comprise a processor in electronic communication with the pressure monitor and the vent line conductance control valve; and a tangible, non-transitory memory configured to communicate with the processor, the tangible, non-transitory memory having instructions stored thereon that, in response to execution by the processor, cause the processor to perform, or facilitate the performance of, certain operations. Such operations may comprise monitoring, by the pressure monitor, the vent line pressure within the vent line; detecting, by the processor, a change in the vent line pressure; and/or commanding, by the processor, adjustment of the vent line conductance control valve to cause a valve position of the vent line conductance control valve to be more open or more closed in response to the detecting the change in the vent line pressure. In various embodiments, the detecting the change in the vent line pressure may comprise detecting a difference between the vent line pressure and the reaction chamber pressure in the reaction chamber, and wherein the adjustment by the vent line conductance control valve may be configured to cause the vent line pressure and the reaction chamber pressure to be less different.

In various embodiments, a method may comprise flowing a first gas from a first gas source to a reaction chamber such that the reaction chamber comprises a reaction chamber desired pressure level; flowing a second gas from a second gas source to an exhaust line downstream of the reaction chamber via a vent line while the flowing the first the first gas from the first gas source to the reaction chamber occurs, wherein the vent line may be in fluid communication with the second gas source and the exhaust line and bypasses the reaction chamber; ceasing the flow of the first gas to the reaction chamber; decreasing and/or ceasing the flow of the second gas to the exhaust line; flowing the second gas to the reaction chamber in response to decreasing and/or ceasing the flow of the second gas to the exhaust line such that the reaction chamber may maintain the reaction chamber desired pressure level; monitoring, via a pressure monitor coupled to the vent line, a vent line pressure of the vent line; and/or adjusting a vent line conductance control valve coupled to the vent line based on the vent line pressure detected by the pressure monitor.

In various embodiments, the pressure monitor may be in electronic communication with the vent line conductance control valve via a processor, which may receive pressure feedback from the pressure monitor and may transmit a command to the vent line conductance control valve, causing the adjusting the vent line conductance control valve. In various embodiments, decreasing and/or ceasing the flow of the second gas to the exhaust line may occur while with ceasing the flow of the first gas to the reaction chamber occurs. In various embodiments, flowing the second gas from the second gas source to the exhaust line via the vent line may comprise flowing the second gas through a second gas supply path, which may comprise a second gas mainline and a second gas branch line, wherein the second gas mainline may be in fluid communication with the reaction chamber, and wherein the second gas branch line may be in fluid communication with the vent line. Decreasing or ceasing the flow of the second gas to the exhaust line may occur in response to at least partially closing a second branch line valve coupled to the second gas branch line. Flowing the second gas to the reaction chamber may occur in response to at least partially opening a second mainline valve coupled to the second gas mainline downstream of the second gas branch line.

In various embodiments, the method may further comprise detecting an increase in the vent line pressure, wherein the adjusting the vent line conductance control valve may comprise causing a valve position of the vent line conductance control valve to be more closed to allow less flow through the vent line; and/or detecting a decrease in the vent line pressure, wherein the adjusting the vent line conductance control valve may comprise causing a valve position of the vent line conductance control valve to be more open to allow greater flow through the vent line.

In various embodiments, a method may comprise flowing a first gas from a first gas source to a reaction chamber such that the reaction chamber comprises a reaction chamber desired pressure level; flowing a second gas from a second gas source to an exhaust line downstream of the reaction chamber via a vent line while the flowing the first first gas from the first gas source to the reaction chamber occurs, wherein the vent line may be in fluid communication with the second gas source and the exhaust line and bypasses the reaction chamber; ceasing the flow of the first gas to the reaction chamber; decreasing and/or ceasing the flow of the second gas to the exhaust line; flowing the first gas to the exhaust line via the vent line in response to ceasing the flow of the first gas to the reaction chamber, wherein the vent line may be in fluid communication with the first gas source; flowing the second gas to the reaction chamber in response to decreasing and/or ceasing flowing the second gas to the exhaust line such that the reaction chamber may maintain the reaction chamber desired pressure level; monitoring, via a pressure monitor coupled to the vent line, a vent line pressure; and/or adjusting a vent line conductance control valve coupled to the vent line based on the vent line pressure detected by the pressure monitor. In various embodiments, decreasing and/or ceasing the flow of the second gas to the exhaust line may occur while the ceasing the flow of the first gas to the reaction chamber occurs. In various embodiments, flowing the second gas to the reaction chamber may occur while the flowing the first gas to the exhaust line occurs.

In various embodiments, flowing the first gas from the first gas source to the reaction chamber may comprise flowing the first gas through a first gas supply path, which may comprise a first gas mainline and a first gas branch line, wherein the first gas mainline may be in fluid communication with the reaction chamber, and wherein the first gas branch line may be in fluid communication with the vent line. Ceasing the flow of the first gas to the reaction chamber may occur in response to closing a first mainline valve coupled to the first gas mainline downstream of the first gas branch line. Flowing the first gas to the exhaust line via the vent line may occur in response to opening a first branch line valve coupled to the first gas branch line.

In various embodiments, flowing the second gas from the second gas source to the exhaust line via the vent line may comprise flowing the second gas through a second gas supply path, which may comprise a second gas mainline and a second gas branch line, wherein the second gas mainline may be in fluid communication with the reaction chamber, and wherein the second gas branch line may be in fluid communication with the vent line. Decreasing and/or ceasing the flow of the second gas to the exhaust line may occur in response to at least partially closing a second branch line valve coupled to the second gas branch line. Flowing the second gas to the reaction chamber may occur in response to at least partially opening a second mainline valve coupled to the second gas mainline downstream of the second gas branch line.

In various embodiments, the method may further comprise detecting a decrease in the vent line pressure, wherein the adjusting the vent line conductance control valve may comprise causing a valve position of the vent line conductance control valve to be more open to allow more flow through the vent line; and/or detecting an increase in the vent line pressure, wherein the adjusting the vent line conductance control valve may comprise causing a valve position of the vent line conductance control valve to be more closed to allow less flow through the vent line. In various embodiments, detecting the decrease in the vent line pressure and/or detecting the increase in the vent line pressure may comprise detecting a difference in the vent line pressure relative to a reaction chamber pressure in the reaction chamber. In various embodiments, adjusting the vent line conductance control valve may cause the vent line pressure to be less different than the reaction chamber pressure.

For the purpose of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the embodiments disclosed herein may be carried out in a manner that achieves or optimizes one advantage or group of advantages as taught or suggested herein without necessarily achieving other objects or advantages as may be taught or suggested herein.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition," "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "contaminant" may refer to any unwanted material disposed within the reaction chamber that may affect the purity of a substrate or layer disposed in the reaction chamber, or any unwanted material in any component of a reaction system. The term "contaminant" may refer to, but is not limited to, unwanted deposits, metal and non-metal particles, impurities, and waste products, disposed within the reaction chamber or other components of the reactor system.

As used herein, the term "gas" may include vaporized solid and/or liquid and may be constituted by a single gas or a mixture of gases.

Figure 1:
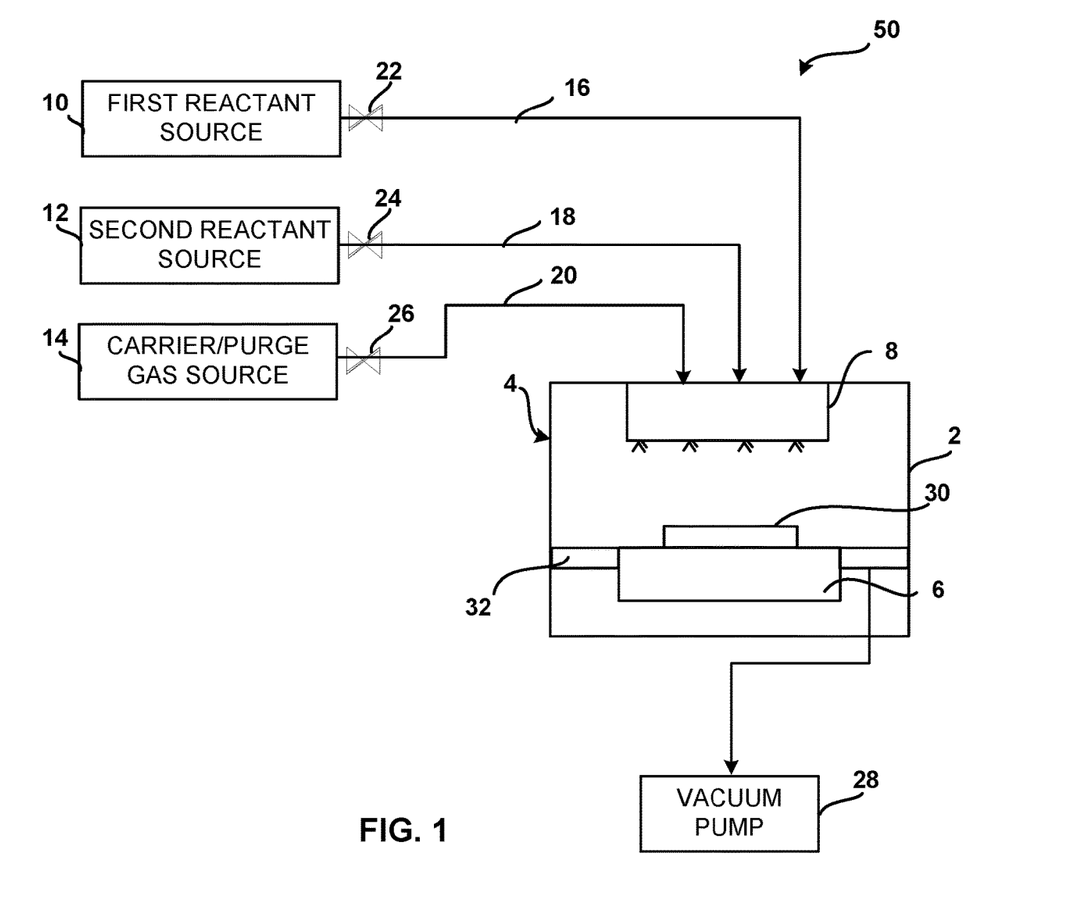
FIG. 1 illustrates a schematic diagram of a reactor system, in accordance with various embodiments.

Reactor systems used for ALD, CVD, and/or the like, may be used for a variety of applications, including depositing and etching materials on a substrate surface. In various embodiments, with reference to FIG. 1, a reactor system 50 may comprise a reaction chamber 4, a susceptor 6 to hold a substrate 30 during processing, a gas distribution system 8 (e.g., a showerhead) to distribute one or more reactants to a surface of substrate 30, one or more reactant sources 10, 12, and/or a carrier and/or purge gas source 14, fluidly coupled to reaction chamber 4 via lines 16-20, and valves or controllers 22-26. Reactant gases or other materials from reactant sources 10, 12 may be applied to substrate 30 in reaction chamber 4. A purge gas from purge gas source 14 may be flowed to and through reaction chamber 4 to remove any excess reactant or other undesired materials from reaction chamber 4. System 50 may also comprise a vacuum source 28 fluidly coupled to the reaction chamber 4, which may be configured to suck reactants, a purge gas, or other materials out of reaction chamber 4.

Various processes (e.g., for depositing a material on a substrate in a reaction chamber (e.g., reaction chamber 4), etch, and/or cleaning) may be better regulated in response to the pressure within the reaction chamber being substantially constant (e.g., the reaction chamber pressure being maintained at a desired level and/or within a desired range). Processes, such as deposition, etch, and/or cleaning processes, may comprise switching gases being delivered to the reaction chamber. For example, in a deposition process, a first reactant gas may be delivered to the reaction chamber, followed by a purge gas to purge any contaminants or leftover first reactant gas, and then a second reactant gas may be delivered to the reaction chamber.

As used herein, the terms "substantially constant," "substantially similar," "substantially equal," and/or the like may be interpreted to refer to an immaterial fluctuation, less than a detectable fluctuation, a fluctuation that does not materially affect the desired or intended result or properties, and/or a fluctuation recognized by a skilled artisan as nearly flat, such that the difference is less than 20%, less than 10%, less than 5%, or less than 1% of an average value or reference fluctuation, or any ranges thereof relative to a comparative or referenced fluctuation in some embodiments. In various embodiments, a substantially constant pressure (e.g., a pressure in the reaction chamber of a reactor system, or any other component comprised therein) may refer to a difference between a maximum pressure and a minimum pressure during the processing of a substrate in the reaction chamber which is less than 200 Pa, 100 Pa, 50 Pa, 10 Pa, 3, Pa, or 1 Pa.

As used herein, "substantially simultaneously" may reference two or more actions or events occurring at or near the same time, and/or being synchronized within a desired duration (e.g., within 1 second, one millisecond, or the like)). For example, a human observer may determine that two substantially simultaneous actions or events occurred at the same time. One or more substantially simultaneous actions or events may occur within five seconds, one second, one-tenth of a second, one millisecond of, or simultaneously with, each other.

Figure 2:
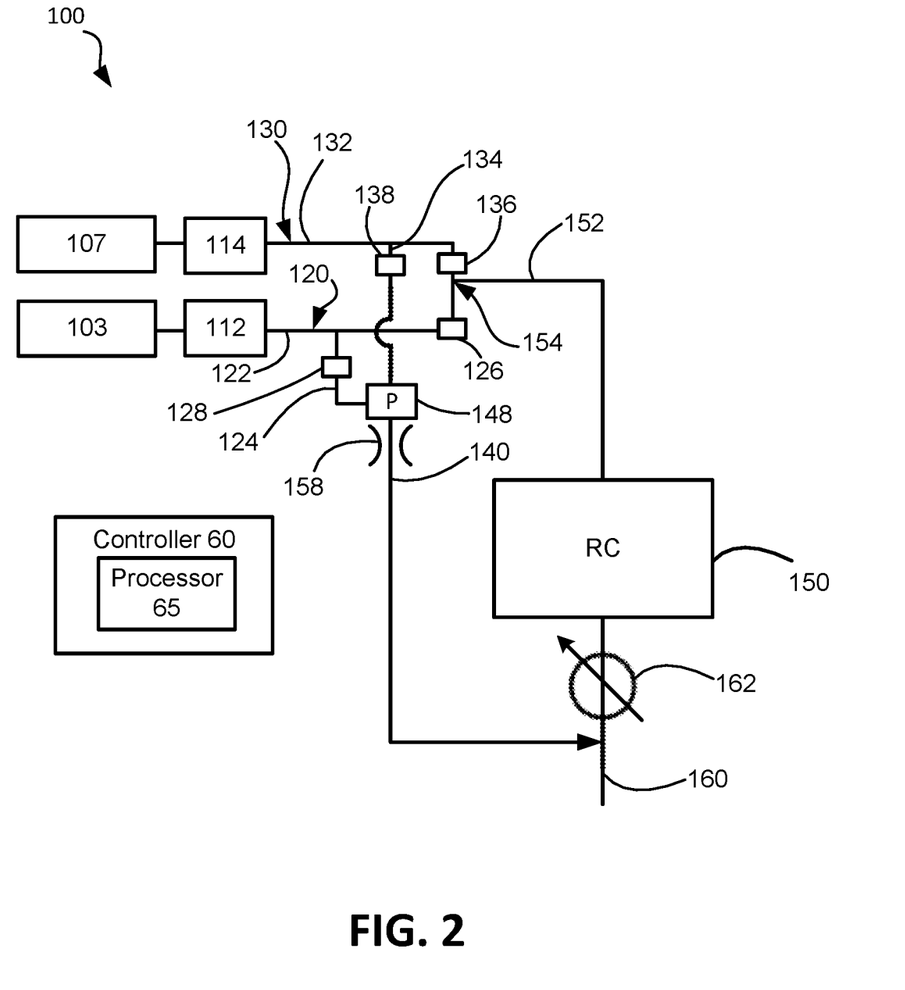
FIG. 2 illustrates a schematic diagram of a gas supply system and a reaction chamber for a reactor system, in accordance with various embodiments.
Figure 3:
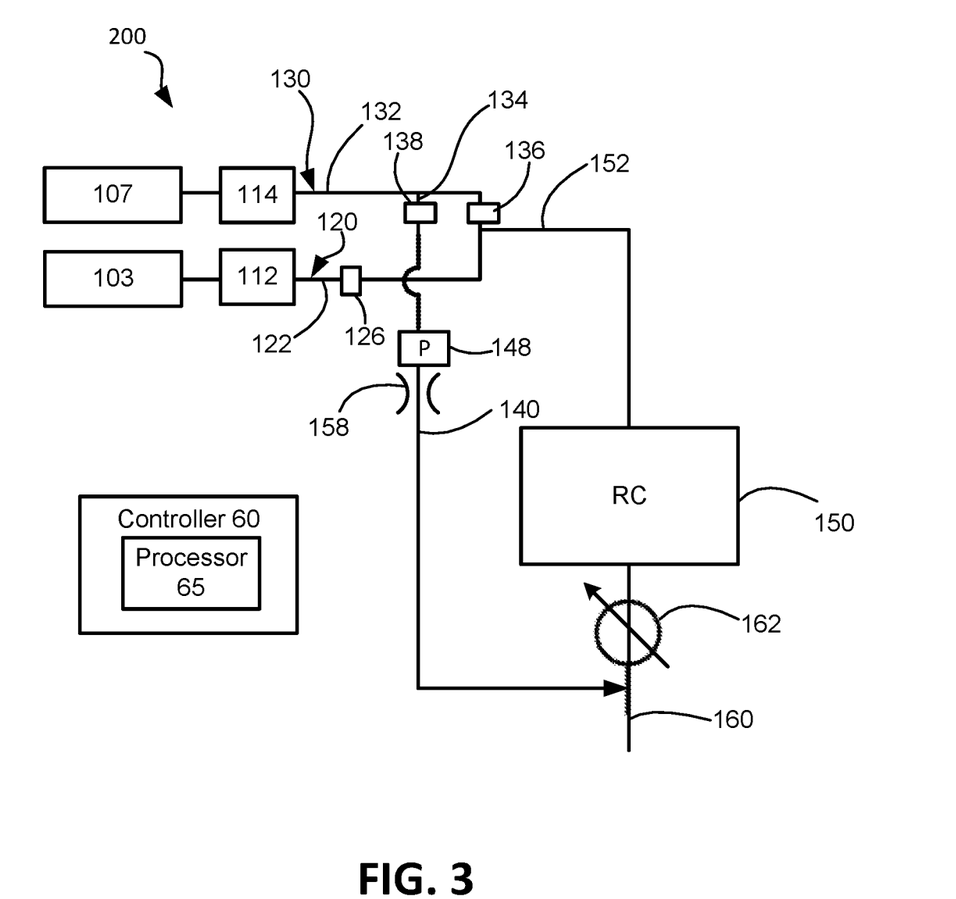
FIG. 3 illustrates a schematic diagram of another gas supply system and a reaction chamber for a reactor system, in accordance with various embodiments.

With reference to FIGS. 2 and 3, gas supply systems 100 and 200 of a reactor system may comprise a first gas source 103 fluidly coupled to a first mass flow controller (MFC) 112, and a second gas source 107 fluidly coupled to a second MFC 114. First gas source 103 and second gas source 107 may be in fluid communication with reaction chamber 150. In various embodiments, a first gas may be supplied from first gas source 103 through a first gas supply path 120, which may be in fluid communication with reaction chamber 150. In various embodiments, a second gas may be supplied from second gas source 107 through a second gas supply path 130, which may be in fluid communication with reaction chamber 150.

In various embodiments, first gas supply path 120 and/or second gas supply path 130 may be coupled to reaction chamber 150 such that first gas supply path 120 and/or second gas supply path 130 are in direct fluid communication with reaction chamber. In various embodiments, gas supply systems 100 and 200 may comprise a chamber inlet path 152 fluidly coupled to reaction chamber 150. Chamber inlet path 152 may be fluidly coupled to first gas supply path 120 and/or second gas supply path 130. In various embodiments, first gas supply path 120 and second gas supply path 130 may be coupled to chamber inlet path 152 at a convergence point 154, at which first gas supply path 120, second gas supply path 130, and chamber inlet path 152 converge and fluidly couple with one another. In various embodiments, first gas supply path 120 and/or second gas supply path 130 may couple to chamber inlet path 152 at separate locations. Accordingly, in various embodiments, a first gas from first gas source 103 may be supplied to reaction chamber 150 by traveling through first gas supply path 120 and chamber inlet path 152. Similarly, a second gas from second gas source 107 may be supplied to reaction chamber 150 by traveling through second gas supply path 130 and chamber inlet path 152. In various embodiments, first gas supply path 120 may be fluidly coupled to reaction chamber 150 and/or chamber inlet path 152 at a first gas supply path end, and second gas supply path 130 may be fluidly coupled to reaction chamber 150 and/or chamber inlet path 152 at a second gas supply path end.

In various embodiments, during processes occurring in reaction chamber 150 (e.g., a deposition, etch, and/or cleaning process), different gases may be supplied to reaction chamber 150 at different times. For example, the first gas from first gas source 103 may be supplied to reaction chamber 150 (e.g., in a constant flow for a period of time, in pulses at an suitable rate and/or for any suitable duration, and/or the like), and subsequently the second gas from second gas source 107 may be supplied to reaction chamber 150 (e.g., at the same time or at a different time than the first gas). In various embodiments, the first gas and second gas may be supplied to reaction chamber 150 in deposition cycles. A deposition cycle may comprise, for example, supplying the first gas to reaction chamber 150 and then supplying the second gas to reaction chamber 150, wherein such a cycle may be repeated. In various embodiments, the reactor system and gas supply system therein may comprise any suitable number of gas sources, such as a third gas source. In such an embodiment, a deposition cycle on the substrate may comprise supplying the first gas, then the second gas, and then the third gas to the reaction chamber. The gases used in the process may be any suitable type of gas, such as a reactant gas (or a gas comprising any material that will be deposited or react to create a deposited layer on the substrate) or a purge gas used to remove any access reactant gas or byproduct/contaminant from the reaction chamber before the next step in the deposition process.

In various embodiments, gas supply systems 100 and 200 may comprise a vent line 140 configured to transport the first or second gas to an exhaust line 160 fluidly coupled to reaction chamber 150, downstream of reaction chamber 150. Exhaust line 160 may be fluidly coupled to, and upstream of, a vacuum source (e.g., vacuum source 28 in FIG. 1). Therefore, vent line 140 may provide a gas path to downstream of reaction chamber 150 that bypasses reaction chamber 150 from first gas supply path 120 and/or second gas supply path 130. In various embodiments, a pressure control valve 162 may be coupled to exhaust line 160. Pressure control valve 162 may be configured to open or close to varying degrees to adjust or control the pressure in exhaust line 160 and/or reaction chamber 150 (e.g., similar to operation of conductance control valve 158, discussed herein). Pressure control valve 162 may be controlled by controller 60 and/or processor 65.

In various embodiments, a gas supply path for one or more gas sources may be coupled to a vent line. For example, as shown in gas supply system 100 in FIG. 2, both first gas supply path 120 and second gas supply path 130 may be fluidly coupled to vent line 140. First gas supply path 120 may comprise a first gas mainline 122, which may be fluidly coupled to chamber inlet path 152 and/or reaction chamber 150, and a first gas branch line 124 fluidly coupled between first gas mainline 122 and vent line 140. In various embodiments, first gas branch line 124 may be part of vent line 140. Second gas supply path 130 in gas supply system 100 may comprise second gas mainline 132, which may be fluidly coupled to chamber inlet path 152 and/or reaction chamber 150, and a second gas branch line 134 fluidly coupled between second gas mainline 132 and vent line 140. In gas supply system 200, shown in FIG. 3, first gas supply path 120 may not comprise a first gas branch line or otherwise be in fluid communication with vent line 140.

In various embodiments, a gas supply system (e.g., gas supply systems 100 and 200) may comprise one or more valves to control fluid or gas flow in the various fluid paths of the gas supply system. For example, in gas supply systems 100 and 200, first gas supply path 120 may comprise a first mainline valve 126 coupled to first gas mainline 122 and configured to at least partially increase or decrease the flow of the first gas through first gas mainline 122. First gas supply path 120 may comprise a first branch line valve 128 coupled to first gas branch line 124 and configured to at least partially increase or decrease the flow of the first gas through first gas branch line 124. Similarly, second gas supply path 130 may comprise a second mainline valve 136 coupled to second gas mainline 132 and configured to at least partially increase or decrease the flow of the second gas through second gas mainline 132. In gas supply system 200, second gas supply path 130 may comprise a second branch line valve 138 coupled to second gas branch line 134 and configured to at least partially increase or decrease the flow of the second gas through second gas branch line 134.

In various embodiments, gas supply systems 100 and 200, and/or a reactor system comprising a gas supply system, may comprise one or more processors and/or controllers. A controller (e.g., controller 60) comprising a processor (e.g., processor 65) may be in electronic communication with first mainline valve 126, first branch line valve 128, second mainline valve 136, and/or second branch line valve 138, and/or in electronic communication with a controller controlling such valves. The processor and/or controller may be in electronic communication with a tangible, non-transitory memory configured to communicate with the processor and/or controller, the tangible, non-transitory memory having instructions stored thereon that, in response to execution by the processor and/or controller, cause the processor and/or controller to perform or facilitate operations including at least partially opening or closing the respective first mainline valve 126, first branch line valve 128, second mainline valve 136, and/or second branch line valve 138.

As discussed above, during the processing of a substrate in reaction chamber 150 (or any other process conducted in a reaction chamber), different gases may be supplied to reaction chamber 150 at different times. However, deposition of materials on a substrate may be better controlled to achieve desired results if the pressure within the reaction chamber 150 remains at a desired level (e.g., within a desired pressure range and/or substantially constant). Therefore, it may be beneficial to supply (or increase the supply of) one gas to reaction chamber 150 in response to another gas decreasing or ceasing to be supplied to reaction chamber 150, or otherwise modify flow of gases within a reactor system to achieve a substantially constant reaction chamber pressure (e.g., increase the flow of one gas to reaction chamber 150 in response to the decrease in flow of another gas to reaction chamber 150).

Accordingly, gas supply systems 100, shown in FIG. 2, may be configured to supply gases to reaction chamber 150 to maintain a desired pressure therein (e.g., a substantially constant pressure). The first gas from first gas source 103 may be a reactant gas and the second gas from second gas source 107 may be a purge gas (e.g., a nonreactive gas such as nitrogen gas or a noble gas). However, the first and second gases (or any additional gases from additional gas sources in a reactor system) may be any suitable gases for a particular process or application.

Figure 4:
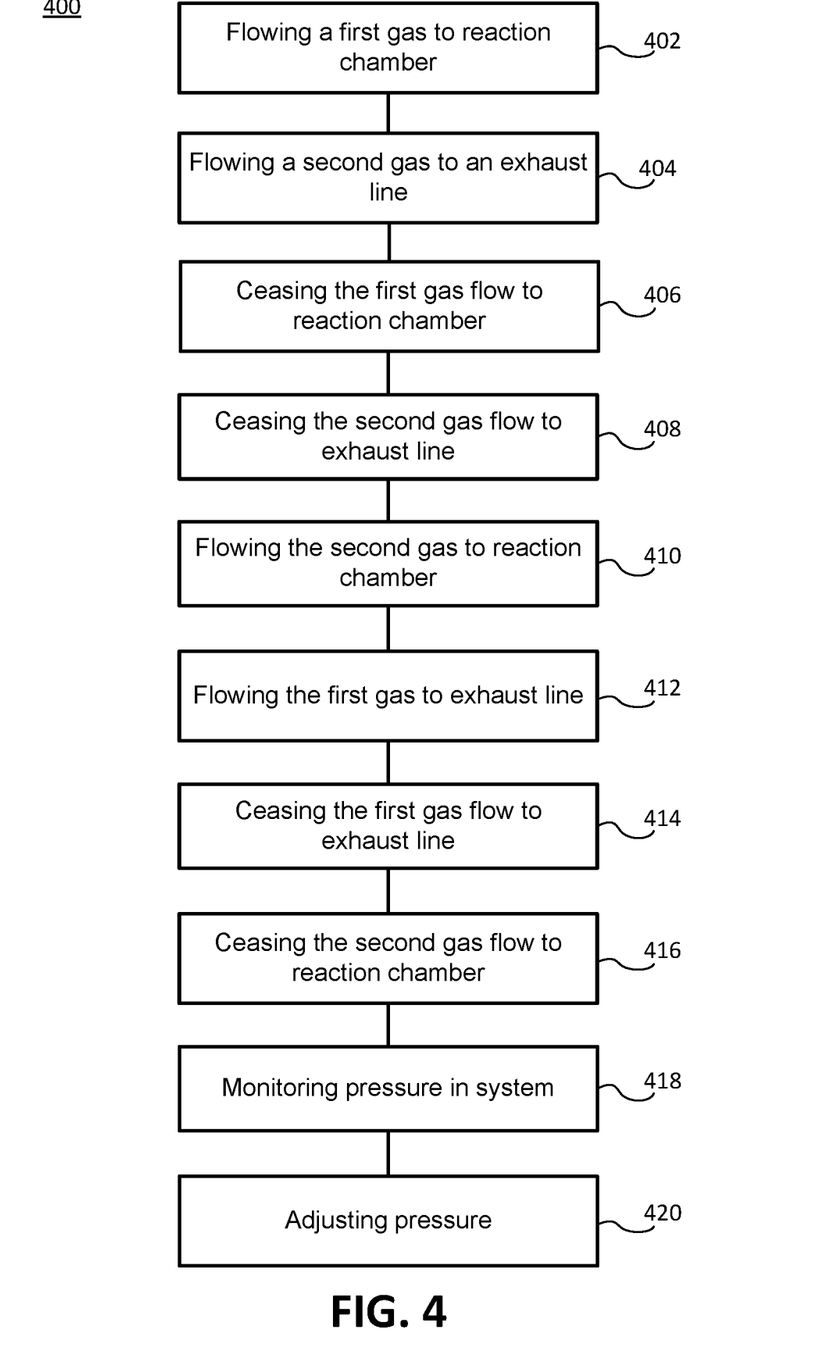
FIG. 4 illustrates a method, in accordance with various embodiments.

With additional reference to FIG. 4, in accordance various embodiments, a method 400 of maintaining a desired pressure within a reaction chamber may comprise flowing the first gas from first gas source 103 to reaction chamber 150 (step 402) through first gas supply path 120. To do so, first mainline valve 126 may be at least partially open and first branch line valve 128 may be closed. While the first gas is being supplied to reaction chamber 150, the second gas from second gas source 107 may be flowing to exhaust line 160 (step 404). To do so, second branch line valve 138 may be at least partially open and second mainline valve 136 may be closed.

The first gas may be supplied to reaction chamber 150 for any suitable duration in any suitable pattern (e.g., a constant stream, pulses, etc.). Likewise, the second gas may be supplied to exhaust line 160 for any suitable duration in any suitable pattern.

In response to the processing or deposition step comprising the first gas in reaction chamber 150 being completed, the flow of the first gas to reaction chamber 150 may cease (step 406) or decrease. To decrease or cease the flow of the first gas to reaction chamber 150, first mainline valve 126 may be at least partially closed such that the first gas cannot flow through first gas mainline 122 to reaction chamber 150. In response to first mainline valve 126 at least partially closing to decrease or cease flow of the first gas through first gas mainline 122, first branch line valve 128 may open to allow the first gas to flow to exhaust line 160 (step 412). In various embodiments, first mainline valve 126 may at least partially close to decrease or cease flow of the first gas through first gas mainline 122 in response to first branch line valve 128 opening to allow the first gas to flow to exhaust line 160. The at least partial closing of first mainline valve 126 and the at least partial opening of first branch line valve 128 may be substantially simultaneous, or within a desired (e.g., predetermined) duration (e.g., within 1 second, one millisecond, or the like).

Because the first gas no longer may be flowing, or may have a decreased flow, to reaction chamber 150, to maintain a desired pressure in reaction chamber 150, the second gas may be routed to reaction chamber 150. The flow of second gas to exhaust line 160 may cease (step 408) or decrease. To decrease or cease the flow of the second gas to exhaust line 160, second branch line valve 138 may be at least partially closed such that the second gas decreases flow, and/or cannot flow, through second branch line valve 138. In response to second branch line valve 138 at least partially closing to decrease or cease flow of the second gas through second gas branch line 134, second mainline valve 136 may at least partially open to allow the second gas to flow to reaction chamber 150 (step 410). In various embodiments, second branch line valve 138 may at least partially close to decrease or cease flow of the second gas through second gas branch line 134 in response to second mainline valve 136 opening to allow the second gas to flow to reaction chamber 150. The at least partial closing of second branch line valve 138 and the at least partial opening of second mainline valve 136 may be substantially simultaneous.

In various embodiments, changing the flow of the first gas from flowing to reaction chamber 150 to flowing to exhaust line 160 may occur substantially simultaneously with, and/or while, changing the flow of the second gas from flowing to exhaust line 160 to flowing to reaction chamber 150. That is, the at least partial closing first mainline valve 126 may occur substantially simultaneously with, and/or while, opening first branch line valve 128, closing second branch line valve 138, and/or opening second mainline valve 136 (and/or the partial opening or closing of any such valves). Therefore, the flowing of a gas to reaction chamber 150 may be continuous, or any change in gas flow to reaction chamber 150 may be minimized or prevented. The processor and/or controller may command and/or otherwise cause the opening or closing of first mainline valve 126, first branch line valve 128, second mainline valve 136, and/or second branch line valve 138 at the desired time(s).

In various embodiments, flow of the first gas to reaction chamber 150 may comprise a first flow rate, causing a pressure within reaction chamber 150. The flow of the second gas to reaction chamber 150 may comprise a second flow rate that is substantially equal to the first flow rate to maintain the pressure within the reaction chamber at a desired level (e.g., between a desired minimum pressure and maximum pressure). Therefore, a pressure fluctuation in reaction chamber 150, which may occur during changing gases flowed to reaction chamber 150, may be minimized or prevented.

To apply the first gas again to a substrate in reaction chamber 150, the steps of method 400 used in relation to gas supply system 100 may further comprise decreasing or ceasing the flow of the first gas to exhaust line 160 (step 414) by at least partially closing first branch line valve 128, and/or decreasing or ceasing the flow of the second gas to reaction chamber 150 (step 416) by at least partially closing second mainline valve 136. In response, method 400 may begin again with flowing the first gas to reaction chamber 150 (step 402) and flowing the second gas to exhaust line 160 (step 404). In various embodiments, changing the flow of the first gas from flowing to exhaust line 160 to flowing to reaction chamber 150 may occur substantially simultaneously with changing the flow of the second gas from flowing to reaction chamber 150 to flowing to exhaust line 160. That is, the opening first mainline valve 126 may occur substantially simultaneously with, and/or while, closing first branch line valve 128, opening second branch line valve 138, and/or closing second mainline valve 136 (and/or the partial opening or closing of any such valves). Therefore, the flowing of a gas to reaction chamber 150 may be substantially continuous, or any change in gas flow to reaction chamber 150 may be minimized or prevented.

In various embodiments, the first gas and the second gas may continuously flow from first gas source 103 and second gas source 107, respectively. Therefore, only changes in the opening or closing of first mainline valve 126, first branch line valve 128, second mainline valve 136, and/or second branch line valve 138 may be required to change the flow (e.g., flow destination and/or flow rate) of the first gas and the second gas, rather than additional required actions such as starting and stopping, or increasing and decreasing, gas flow from first gas source 103 and second gas source 107.

Similar to gas supply system 100, described above in relation to method 400, gas supply systems 200, shown in FIG. 3, may be configured to supply gases to reaction chamber 150 to maintain a desired pressure (e.g., a substantially constant pressure) therein. The first gas from first gas source 103 may be a reactant gas and the second gas from second gas source 107 may be a purge gas (e.g., a nonreactive gas such as nitrogen gas or a noble gas). However, the first and second gases (or any additional gases from additional gas sources in a reactor system) may be any suitable gases for a particular process or application.

With additional reference to FIG. 4, in accordance various embodiments, a method 400 of maintaining a desired pressure within a reaction chamber (as applied to gas supply system 200) may comprise flowing the first gas from first gas source 103 to reaction chamber 150 (step 402) through first gas supply path 120. To do so, first mainline valve 126 may be at least partially open. While the first gas is being supplied to reaction chamber 150, the second gas from second gas source 107 may be flowing to exhaust line 160 (step 404). To do so, second branch line valve 138 may be at least partially open and second mainline valve 136 may be closed.

The first gas may be supplied to reaction chamber 150 for any suitable duration in any suitable pattern (e.g., a constant stream, pulses, etc.). Likewise, the second gas may be supplied to exhaust line 160 for any suitable duration in any suitable pattern.

In response to the processing or deposition step comprising the first gas in reaction chamber 150 being completed, the flow of the first gas to reaction chamber 150 may cease (step 406) or decrease. To decrease or cease the flow of the first gas to reaction chamber 150, first mainline valve 126 may be at least partially closed such that the first gas decreases flow, and/or cannot flow, through first gas mainline 122 and/or first gas flow from first gas source may decrease or cease (e.g., via MFC 112). For example, the flow of first gas from first gas source 103 may decrease or stop, as opposed to the first gas flow in gas supply system 100, which may be continuous and directed from flowing to reaction chamber 150 to flowing to exhaust line 160. In various embodiments, first mainline valve 126 may at least partially close and/or the flow of first gas from first gas source 103 may decrease or cease to decrease or cease flow of the first gas through first gas mainline 122 in response a command from a processor and/or controller (e.g., to first mainline valve 126 and/or MFC 112).

Because the first gas no longer may be flowing, or may have a decreased flow, to reaction chamber 150, to maintain the pressure in reaction chamber 150 at a desired level, the second gas may be routed to reaction chamber 150. The flow of second gas to exhaust line 160 may cease (step 408) or decrease. To decrease or cease the flow of the second gas to exhaust line 160, second branch line valve 138 may be at least partially closed such that the second gas decreases flow, and/or cannot flow, through second branch line valve 138. In response to second branch line valve 138 at least partially closing to decrease or cease flow of the second gas through second gas branch line 134, second mainline valve 136 may at least partially open to allow the second gas to flow to reaction chamber 150 (step 410). In various embodiments, second branch line valve 138 may at least partially close to decrease or cease flow of the second gas through second gas branch line 134 in response to second mainline valve 136 opening to allow the second gas to flow reaction chamber 150. The at least partial closing of second branch line valve 138 and the at least partial opening of second mainline valve 136 may occur substantially simultaneously.

In various embodiments, decreasing or ceasing the flow of the first gas from first gas source 103 to reaction chamber 150 may occur substantially simultaneously with, and/or while, changing the flow of the second gas from flowing to exhaust line 160 to flowing to reaction chamber 150. That is, decreasing or ceasing the first gas flow to reaction chamber 150 may occur substantially simultaneously with, and/or while, closing second branch line valve 138 and/or opening second mainline valve 136 (and/or the partial opening or closing of any such valves). Therefore, the flowing of a gas to reaction chamber 150 may be continuous and substantially constant, or any change in gas flow to reaction chamber 150 may be minimized or prevented. Accordingly, the pressure within reaction chamber 150 may remain at a desired level (e.g., substantially constant). The processor and/or controller may command and/or otherwise cause the decrease or ceasing of the first gas flow and/or the at least partial opening or closing of first mainline valve 126, second mainline valve 136, and/or second branch line valve 138 at the desired time(s).

In various embodiments, flow of the first gas to reaction chamber 150 may comprise a first flow rate, causing a pressure within reaction chamber 150. The flow of the second gas to reaction chamber 150 may comprise a second flow rate that is substantially equal to the first flow rate to maintain the pressure within the reaction chamber at a desired level (between an acceptable minimum pressure and maximum pressure). Therefore, a pressure fluctuation in reaction chamber 150, which may occur during changing gases flowed to reaction chamber 150, may be minimized or prevented.

To apply the first gas again to a substrate in reaction chamber 150, the steps of method 400 used in relation to gas supply system 200 may further comprise decreasing or ceasing the flow of the second gas to reaction chamber 150 (step 416) by at least partially closing second mainline valve 136 and/or at least partially opening second branch line valve 138. In response, method 400 may begin again with flowing the first gas to reaction chamber 150 (step 402) and flowing the second gas to exhaust line 160 (step 404). First gas may begin flowing to reaction chamber 150 again by at least partially opening first mainline valve 126 and/or starting the flow of the first gas from first gas source 103 (e.g., via MFC 112). In various embodiments, starting the flow of the first gas to reaction chamber 150 may occur substantially simultaneously with changing the flow of the second gas from flowing to reaction chamber 150 to flowing to exhaust line 160. That is, the starting the flowing of the first gas from first gas source 103 to reaction chamber may occur substantially simultaneously with opening first mainline valve 126, opening second branch line valve 138, and/or closing second mainline valve 136 (and/or the partial opening or closing of any such valves). Therefore, the flowing of a gas to reaction chamber 150 may be continuous, or any change in gas flow to reaction chamber 150 may be minimized or prevented.

In various embodiments, the second gas may continuously flow from second gas source 107. Therefore, only changes in the opening or closing of second mainline valve 136 and/or second branch line valve 138 may be required to change the flow (e.g., flow destination and/or flow rate) of the second gas, rather than additional required actions such as starting and stopping, or increasing and decreasing, gas flow from second gas source 107. Additionally, a change in the second gas flow (e.g., changing from flow of the second gas to exhaust line 160 to flowing to reaction chamber 150, or vice versa) may occur in response to detecting a starting or stopping of flow of the first gas. That is, a processor and/or controller may detect the at least partial ceasing or starting of first gas flowing from first gas source 103, and in response, the processor and/or controller may cause the appropriate change in the flow of the second gas based on the flow of the first gas. For example, in response to detecting the first gas ceasing flow to reaction chamber 150, the flow of the second gas may be directed to reaction chamber 150. In response to detecting the first gas starting flow to reaction chamber 150, the flow of the second gas may be at least partially directed to exhaust line 160. In various embodiments, the first gas flow may start and/or cease (or increase and/or decrease) based on, or in response to, the processor and/or controller detecting a change in the flow destination of the second gas. For example, in response to detecting the second gas ceasing flow to reaction chamber 150 and/or starting flow to exhaust line 160, the flow of the first gas may begin (e.g., to reaction chamber 150). In response to detecting the second gas flowing to reaction chamber 150 and/or ceasing flow to exhaust line 160, the flow of the first gas (e.g., to reaction chamber 150) may cease. Such changes in gas flow may occur substantially simultaneously, as discussed herein.

The steps of method 400 may be completed in any suitable order and/or combination, depending on the gas supply system used to implement the method (e.g., different step order/combinations of method 400 may be used between gas supply system 100 and gas supply system 200).

In various embodiments, flow rates of the first and second gases from first gas source 103 and second gas source 107, respectively, may be regulated by MFC 112 and MFC 114 (the "MFCs"). The MFCs may detect the flow rates of the first and second gases therethrough (MFC 112 may detect the flow rate of the first gas and MFC 114 may detect the flow rate of the second gas), and adjust the flow rate (e.g., by adjusting a valve comprised in the MFCs) based on a difference detected between the actual flow rates detected and desired flow rates.

The flow rates from MFCs 112 and 114 may be based on, or in response to, a pressure within the gas path through which the respective gas is flowing. For example, when the first gas or the second gas is flowing through vent line 140 to exhaust line 160 (e.g., while one the of the two gases is flowing to reaction chamber 150), and there is a pressure change within vent line 140 and/or exhaust line 160, the respective MFC (and/or a processor and/or controller in electronic communication therewith) may increase or decrease the flow of the first gas or second gas to compensate for the pressure change. Similarly, when the first gas or the second gas is flowing through first gas mainline 122 or second gas mainline 132, respectively, (and chamber inlet path 152) to reaction chamber 150, and there is a pressure change within first gas mainline 122, second gas mainline 132, chamber inlet path 152, and/or reaction chamber 150, the respective MFC (and/or a processor and/or controller in electronic communication therewith) may increase or decrease the flow of the first gas or second gas to compensate for the pressure change.

However, such a change in pressure and/or gas flow for one of the first or second gases may cause fluctuation in gas flow to reaction chamber 150 during switching which gas is flowing to reaction chamber 150, and therefore, may cause undesired pressure fluctuation in reaction chamber 150. For example, if the gas flow rates of the first gas through MFC 112 and the second gas through MFC 114 are equal, but then MFC 114 changes the flow rate of the second gas to compensate for a pressure change detected in the vent line 140 and/or exhaust line 160 (while the second gas is flowing therethrough), the flow rate of the second gas is now different than the flow rate of the first gas. Therefore, when the first gas ceases being flowed to reaction chamber 150, and the flow of the second gas is switched from flowing to exhaust line 160 to flowing to reaction chamber 150, the different flow rate of the second gas may cause an undesired pressure fluctuation in reaction chamber 150.

In various embodiments, vent line 140 may comprise a conductance control valve 158. Conductance control valve 158 may be coupled, and fluidly coupled, to vent line 140 such that the first gas or second gas flowing therethrough also flows through conductance control valve 158. Conductance control valve 158 may be configured to allow adjustment of the pressure within vent line 140 and/or exhaust line 160 while maintaining a substantially constant flow rate of the gas flowing through vent line 140 and/or exhaust line 160. Therefore, the flow rate of the first gas via MFC 112, and the flow rate of the second gas via MFC 114, may be substantially constant (e.g., as commanded by a processor and/or controller), and the pressure within vent line 140 and/or exhaust line 160 may be adjusted via conductance control valve 158. Conductance control valve 158 may be any suitable device such as a needle valve, throttle valve, or the like.

In various embodiments, gas supply systems 100 and 200 may further comprise a pressure monitor 148 configured to monitor the pressure within system 100 or 200 (step 418 of method 400). For example, pressure monitor 148 may be coupled to vent line 140 and may be configured to monitor a pressure within vent line 140 and/or exhaust line 160. Pressure monitor 148 may comprise and/or be in electronic communication with a processor and/or controller. Accordingly, in various embodiments, pressure monitor 148 may transmit pressure readings of the pressure in vent line 140 and/or exhaust line 160 to the processor and/or controller. Pressure monitor 148 may take and/or transmit pressure readings at any desired time, for any desired duration, in any desired pattern (e.g., one reading per second, or the like). A desired pressure within vent line 140 and/or exhaust line 160 may be determined by the processor and/or controller (e.g., by user input and/or as part of the conditions for a particular process). The processor and/or controller may receive the pressure readings from pressure monitor 148 and compare them with the desired pressure. In response to detecting a difference between the actual pressure detected and the desired pressure (or a difference outside an acceptable level), the processor and/or controller may command conductance control valve 158 to adjust the pressure within vent line 140 and/or exhaust line 160 as appropriate to be closer to the desired pressure value. In response, conductance control valve 158 may adjust (e.g., further open or close) to adjust the pressure (step 420 of method 400) in vent line 140 and/or exhaust line 160 to achieve a value closer to or equal to the desired pressure value.

In various embodiments, any gas path within gas supply systems 100 and 200 may comprise a conductance control valve to allow adjustment of the pressure within the respective gas path. For example, first gas mainline 122, first gas branch line 124, second gas mainline 132, second gas branch line 134, and/or chamber inlet path 152 may comprise a conductance control valve similar to conductance control valve 158. A processor and/or controller may be in electronic communication with any or all such conductance control valves, receive pressure values from the conductance control valves for the pressures within the respective gas path of systems 100 and 200, and compare such pressure values to desired pressure values for each respective gas path. In response to detecting a difference between the measured pressure value and desired pressure value for a certain gas path within the system, the processor and/or controller may command that the respective conductance control valve adjust to cause the pressure within the gas path to be closer to or equal to the respective desired pressure.

During processes (e.g., deposition, etch, cleaning, and/or the like) using gas supply system 100 and/or 200, if the pressure within vent line 140 differs significantly from the pressure within first gas mainline 122, second gas mainline 132, chamber inlet path 152, and/or reaction chamber 150, the gas flow rate therethrough may differ when switching a gas from flowing to exhaust line 160 to flowing to reaction chamber 150, or vice versa. As discussed herein, such a gas flow rate fluctuation may cause the pressure in reaction chamber 150 to fluctuate (e.g., during switching which gas is flowing to reaction chamber 150). Such pressure fluctuation within reaction chamber 150 may not be desired, and may negatively affect the results (e.g., deposition of materials on a substrate within reaction chamber 150 during a deposition process).

Therefore, the presence of a conductance control valve (e.g., conductance control valve 158) within a gas supply system may allow periodic and/or constant monitoring of the pressure within one or more gas paths in the system. In various embodiments, such monitoring may be in real time or near real time. Therefore, a pressure fluctuation (e.g., caused by the accumulation of contaminants (e.g., deposited reactant, byproduct, outgassed materials, and/or the like) in the respective gas path) may be detected and addressed (e.g., via an adjustment of the conductance control valve) quickly to mitigate or avoid any resulting flow rate and/or pressure fluctuation in reaction chamber 150.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A reactor system, comprising:
a first gas source comprising a reactant;
a first gas supply path fluidly coupled to the first gas source, the first gas supply path comprising a first gas mainline and a first gas branch line;
a second gas source;
a second gas supply path fluidly coupled to the second gas source;
a reaction chamber fluidly coupled to the first gas supply path and the second gas supply path, wherein the first gas supply path is fluidly coupled to the reaction chamber at a first gas supply path end, and the second gas supply path is fluidly coupled to the reaction chamber at a second gas supply path end,
wherein a first gas is supplied to the reaction chamber from the first gas source and a second gas is supplied to the reaction chamber from the second gas source to achieve stability of a reaction chamber pressure;
an exhaust line fluidly coupled to and downstream from the reaction chamber;
a vent line fluidly coupled to at least one of the first gas supply path and the second gas supply path, and to the exhaust line, wherein the vent line bypasses the reaction chamber;
a pressure monitor coupled to the vent line configured to monitor a vent line pressure within the vent line;
a vent line conductance control valve coupled to the vent line, wherein the vent path conductance control valve is configured to adjust in response to feedback from the pressure monitor; and
a controller configured to:
control a first gas branch line valve within the first gas branch line to control a flow of the reactant to the vent line;
monitor, via the pressure monitor, a vent line pressure of the vent line;
adjust the vent line conductance control valve based on the vent line pressure detected by the pressure monitor; and
decrease, without ceasing a flow of the second gas to the exhaust line while decreasing without ceasing the flow of the first gas to the reaction chamber.

2. The reactor system of claim 1, wherein the reaction chamber is fluidly coupled to the first gas supply path and the second gas supply path via a chamber inlet path upstream of the reaction chamber, wherein the first gas supply path is fluidly coupled to the chamber inlet path at the first gas supply path end, and the second gas supply path is fluidly coupled to the chamber inlet path at the second gas supply path end.

3. The reactor system of claim 1, wherein the vent line is fluidly coupled to the first gas supply path and the second gas supply path.

4. The reactor system of claim 1, wherein the second gas supply path comprises a second gas mainline and a second gas branch line, wherein the second gas mainline is in fluid communication with the reaction chamber, and wherein the second gas branch line is in fluid communication with the vent line.

5. The reactor system of claim 4, wherein the first gas mainline comprises a first mainline valve disposed upstream of the reaction chamber and downstream of the first gas branch line, wherein the first gas branch line comprises the first branch line valve,
wherein the second gas mainline comprises a second mainline valve disposed upstream of the reaction chamber and downstream of the second gas branch line, wherein the second gas branch line comprises a second branch line valve, wherein the second branch line valve is configured to at least partially increase or decrease a gas flow through the second gas branch line.

6. The reactor system of claim 1, further comprising:
a first mass flow controller between the first gas source and the vent line; and
a second mass flow controller between the second gas source and the vent line.

7. The reactor system of claim 6, wherein the controller is further configured to detect at least partial ceasing or starting of the first gas flowing from the first gas source, and in response, cause a corresponding change in the flow of the second gas based on a command to the second mass flow controller.

8. The reactor system of claim 6, wherein the controller causes the first mass flow controller to increase flow of the first gas in response to reducing a flow of the second gas to the reaction chamber.

9. The reactor system of claim 6, wherein the controller causes a change in flowrate from the first mass flow controller based on a pressure within the reaction chamber.

10. The reactor system of claim 6, wherein the controller causes a change in flowrate from the first mass flow controller based on the vent line pressure.

11. The reactor system of claim 10, wherein the controller causes a change in flowrate from the second mass flow controller based on the vent line pressure.

12. The reactor system of claim 1, wherein the monitoring comprises detecting a difference in the vent line pressure relative to a reaction chamber pressure in the reaction chamber.

13. The reactor system of claim 12, wherein the controller is further configured to adjust the vent line conductance control valve to cause the vent line pressure to be less different than the pressure in the reaction chamber.

* * * * *